(12) United States Patent
Schuppich et al.

(10) Patent No.: US 7,247,276 B2
(45) Date of Patent: Jul. 24, 2007

(54) MICRO-REACTOR FOR REACTIONS BETWEEN GASES AND LIQUIDS

(75) Inventors: Harald Schuppich, Schoeneck (DE); Klaus Golbig, Harxheim (DE); Bernd Dittmann, Sulzbach (DE)

(73) Assignee: Cellular Process Chemistry, Inc., Kennewick, WA (US)

( * ) Notice: Subject to any disclaimer, the term of this patent is extended or adjusted under 35 U.S.C. 154(b) by 635 days.

(21) Appl. No.: 10/343,275

(22) PCT Filed: Jul. 25, 2001

(86) PCT No.: PCT/EP01/08622

§ 371 (c)(1),
(2), (4) Date: Jan. 27, 2003

(87) PCT Pub. No.: WO01/68257

PCT Pub. Date: Sep. 20, 2001

(65) Prior Publication Data

US 2004/0156762 A1    Aug. 12, 2004

(30) Foreign Application Priority Data

Jul. 27, 2000    (DE) ................................ 100 36 602

(51) Int. Cl.
*B01J 8/04* (2006.01)
*B01J 10/00* (2006.01)
(52) U.S. Cl. ................... 422/129; 422/220; 422/224
(58) Field of Classification Search ............. 422/191, 422/220, 224, 129; 366/340, 336, 341
See application file for complete search history.

(56) References Cited

U.S. PATENT DOCUMENTS

| | | | |
|---|---|---|---|
| 3,881,701 A | 5/1975 | Schoenman et al. | 259/4 |
| 4,222,671 A | 9/1980 | Gilmore | 366/337 |
| 4,702,073 A | 10/1987 | Melconian | 60/39 |
| 4,728,502 A | 3/1988 | Hamill | 422/116 |
| 4,748,002 A | 5/1988 | Neimark et al. | 422/116 |

(Continued)

FOREIGN PATENT DOCUMENTS

DE    960 183    3/1957

(Continued)

OTHER PUBLICATIONS van den Berg, A. et al. 1996. "Modular Concept for Miniature Chemical Systems." *DECHEMA Monographs*: 132:109-23.

*Primary Examiner*—N. Bhat
(74) *Attorney, Agent, or Firm*—Ronald M. Anderson

(57) ABSTRACT

Described herein is a microreactor for carrying out chemical reactions between a reaction partner in liquid form and a reaction partner in gaseous form, if necessary in the presence of a solid catalyst, whereby the chemical process guidance takes place in spaces that are formed by two or more essentially coplanar plates or layers, with at least one of these plates or layers being a fluid guidance plate (1) that is structured and/or arranged in such a way that the fluid reaction partner flows in at least one essentially uninterrupted capillary thread along the surface of this plate or layer only due to the influence of gravity and/or capillary forces and thereby comes into contact and reacts with the gaseous reaction partner.

21 Claims, 4 Drawing Sheets

U.S. PATENT DOCUMENTS

| | | | |
|---|---|---|---|
| 4,894,146 A | 1/1990 | Giddings | 209/12.2 |
| 5,122,345 A | 6/1992 | Tabor et al. | 422/116 |
| 5,209,906 A | 5/1993 | Watkins et al. | 422/200 |
| 5,250,263 A | 10/1993 | Manz | 422/81 |
| 5,273,715 A | 12/1993 | Bridgham et al. | 422/63 |
| 5,288,468 A | 2/1994 | Church et al. | 422/116 |
| 5,324,483 A | 6/1994 | Cody et al. | 422/131 |
| 5,399,317 A | 3/1995 | Stolowitz | 422/99 |
| 5,463,564 A | 10/1995 | Agrafiotis | 364/496 |
| 5,468,643 A | 11/1995 | Su et al. | 436/161 |
| 5,482,862 A | 1/1996 | LaPack et al. | 436/52 |
| 5,499,650 A | 3/1996 | McArthur et al. | 137/85 |
| 5,516,423 A | 5/1996 | Conoby et al. | 210/85 |
| 5,534,328 A | 7/1996 | Ashmead et al. | 428/166 |
| 5,580,523 A | 12/1996 | Bard | 422/50 |
| 5,595,712 A | 1/1997 | Harbster et al. | 422/129 |
| 5,641,400 A | 6/1997 | Kaltenbach et al. | 210/198 |
| 5,644,395 A | 7/1997 | Folta | 356/246 |
| 5,658,537 A * | 8/1997 | Dugan | 422/191 |
| 5,681,534 A | 10/1997 | Neves | 422/131 |
| 5,690,763 A * | 11/1997 | Ashmead et al. | 156/60 |
| 5,698,485 A | 12/1997 | Bruck et al. | 501/87 |
| 5,705,018 A | 1/1998 | Hartley | 156/345 |
| 5,727,618 A | 3/1998 | Mundinger et al. | 165/80.4 |
| 5,730,947 A | 3/1998 | Chaussonnet | 422/177 |
| 5,741,466 A | 4/1998 | Bodnaras | 422/228 |
| 5,803,600 A | 9/1998 | Schubert et al. | 366/144 |
| 5,811,062 A * | 9/1998 | Wegeng et al. | 422/129 |
| 5,842,787 A * | 12/1998 | Kopf-Sill et al. | 366/340 |
| 5,928,880 A | 7/1999 | Wilding et al. | 435/7.21 |
| 5,939,024 A | 8/1999 | Robertson | 422/101 |
| 5,961,932 A | 10/1999 | Ghosh et al. | 422/193 |
| 5,976,472 A | 11/1999 | Chatterjee et al. | 422/130 |
| 5,993,750 A | 11/1999 | Ghosh et al. | 422/191 |
| 6,036,355 A | 3/2000 | Yant et al. | 366/171 |
| 6,036,927 A | 3/2000 | Chatterjee et al. | 422/211 |
| 6,063,019 A | 5/2000 | Wade | 494/14 |
| 6,126,723 A | 10/2000 | Drost et al. | 96/4 |
| 6,149,882 A | 11/2000 | Guan et al. | 422/211 |
| 6,171,865 B1 | 1/2001 | Weigl et al. | 436/52 |
| 6,180,081 B1 | 1/2001 | Poschmann et al. | 423/648.1 |
| 6,190,034 B1 | 2/2001 | Nielsen et al. | 366/336 |
| 6,192,596 B1 | 2/2001 | Bennett et al. | 34/76 |
| 6,221,226 B1 | 4/2001 | Kopf-Sill | 204/602 |
| 6,264,900 B1 | 7/2001 | Schubert et al. | 422/224 |
| 6,494,614 B1 | 12/2002 | Bennett et al. | 336/36 |
| 6,537,506 B1 | 3/2003 | Schwalbe et al. | 422/130 |
| 6,656,423 B1 | 12/2003 | Joslyn | 422/1 |
| 6,701,774 B2 | 3/2004 | Srinivasan et al. | 73/23.42 |
| 6,827,095 B2 | 12/2004 | O'Connor et al. | 137/15.01 |
| 2002/0042140 A1 | 4/2002 | Hagemeyer et al. | 436/34 |
| 2002/0045265 A1 | 4/2002 | Bergh et al. | 436/37 |
| 2002/0080563 A1 | 6/2002 | Pence et al. | 361/676 |
| 2002/0151080 A1 | 10/2002 | Dasgupta | 422/55 |
| 2002/0170976 A1 | 11/2002 | Bergh et al. | 236/49.1 |

FOREIGN PATENT DOCUMENTS

| | | |
|---|---|---|
| EP | 0796654 | 3/1997 |
| WO | WO 87/02139 | 4/1987 |
| WO | WO 93/00625 | 1/1993 |
| WO | WO 98/38487 | 3/1998 |
| WO | WO 99/04892 | 7/1998 |
| WO | WO 98/55812 | 12/1998 |
| WO | WO 99/20395 | 4/1999 |
| WO | WO 00/34728 | 6/2000 |
| WO | WO 00/51720 | 9/2000 |
| WO | WO 00/62914 | 10/2000 |
| WO | WO 00/62919 | 10/2000 |
| WO | WO 01/41916 | 6/2001 |
| WO | WO 01/66245 | 9/2001 |
| WO | WO 01/68257 | 9/2001 |
| WO | WO 01/93998 | 12/2001 |

\* cited by examiner

MICRO-REACTOR FOR REACTIONS BETWEEN GASES AND LIQUIDS

The invention concerns a microreactor for carrying out chemical reactions between a reaction partner in fluid form and a reaction partner in gaseous form.

Such a microreactor represents a miniaturized reaction system for chemical engineering and chemical process technology. Microreactors are known, for example, from EP 0 688 242 and the U.S. Pat. No. 5,811,062. These microreactors are composed of a large number of stacked, interconnected platelets, the surfaces of which contain micromechanically produced structures, which, in combination, produce horizontal reaction spaces for carrying out the desired chemical reactions.

However, such microreactors are unsuitable for carrying out reactions between gaseous and liquid reactants, as the reaction partners can not mix sufficiently in the horizontal reaction spaces.

A technique for catalyzed alkoxylation of fat derivates in a thin film reactor is claimed in the German patent application DE 41 28 827. The heat of reaction is discharged via the interior wall of the pipe and the gas phase. The thin film reactor consists of a bundle of vertical pipes, on whose interior an uninterrupted liquid film of reactants and product flows downwards due to the influence of gravity. The exterior diameter of the pipes amounts to 28-65 cm, the length is up to 6 m. A typical macro-liquid film (33 kg/h lauryl alcohol, 180° C.) has a thickness of about 300 µm.

Thick liquid films, as described in the DE 41 28 827, have the following disadvantages:
  A broad variation in residence time produces an undefined reaction time, which in turn leads to over and under-reactions as well as non-conversion, i.e. residual educts in the reaction mixture.
  A long reaction time, if the chemical reaction is diffusion-controlled.
  Poor temperature control leads to the following of alternative reaction paths and thus produces undesired byproducts.

The invention therefore has the underlying task of creating a reactor system that avoids the above-mentioned disadvantages of a common vertical tube reactor.

The task of the invention at hand thus consists in the provision of a reactor for carrying out a continuous chemical reaction between a liquid and a gas, whereby the reaction speed as well as the selectivity of the implementation are increased by a better control of reaction parameters such as film thickness, reaction/contact time and temperature. According to the invention, the microreactor will allow an exact temperature control for the reaction processes, ensure quick mixing of the reactants and reduce the danger potential of strongly exothermal or explosive reactions by featuring a small interior volume. Furthermore, the manufacture of the microreactor should be inexpensive, so that it can be used as a single-use system, if necessary. The different components of the microreactor should be such that they can be combined freely, according to the specific requirements. In particular, the amount of product transformed should be scalable—this is to be achieved by an internal parallelization, which means that any number of identical modules can be combined to form a collective reactor block. The different components should be such that they can be connected to one another in a separable or inseparable fashion.

The invention thus concerns a microreactor for carrying out chemical reactions between a reaction partner in fluid form and a reaction partner in gaseous form, if necessary in the presence of a solid catalyst, whereby the chemical process guidance occurs in spaces that are formed by two or several essentially coplanar plates or layers, whereby at least one of these plates or layers represents a fluid guidance plate (1), which is structured and/or arranged in such a way that the fluid reaction partner flows along the surface of this plate or layer only as a result of the influence of gravity and/or capillary forces in at least one essentially uninterrupted capillary thread and thus comes into contact and reacts with the gaseous reaction partner.

Preferably, the fluid guidance plate is arranged essentially perpendicularly to the horizontal plane.

The term "fluid form" comprises reactants which themselves occur in a fluid state of aggregation as well as reactants that are employed in a mixture with a fluid thinner. The term "mixture with a thinner" comprises solutions, suspensions and emulsions. In a particularly favored optimal realization, the fluid reaction partner is employed in the form of a solution or suspension. It should be recognized that the term fluid as used herein and the claims that follow is intended to refer to a liquid, as opposed to a gas.

The term "reaction partner" comprises pure substances or mixtures that contain the educts, i.e. the reactants.

The shaping of the microreactor according to the invention is in itself uncritical. The individual plates or layers can have any suitable geometrical shape. Preferably, they are square or rectangular.

Essential for the microreactor according to the invention are the dimensions of the microstructured areas in which the fluid reaction partner is brought into contact with the gaseous reaction partner.

The dimensions of the structures on the surface of the fluid guidance plate (1) must be chosen such that the fluid reaction partner can freely pass through them as a result of gravity and/or capillary forces.

On the other hand, the structures have to be small enough in order to utilize the immanent advantages of microreaction technology, namely outstanding temperature control, laminar flow, diffusive mixing and small interior volume. Therefore these structures are of a dimension smaller than 1000 µm, preferably smaller than 800 µm, in particular smaller than 600 µm.

Furthermore, the dimension, in particular the length and arrangement of the fluid guidance plate (1), can be adjusted to the specific reaction requirements such as reaction speed, viscosity of the fluid reaction partner and so on.

Diverse parameters have to be taken into account for the chemical process guidance. Hence it is intended to install sensors in the microreactor, in particular for recording the temperature, the pressure, if necessary the flow speed and the flow rate. The sensors are connected to control loops so that the operating sequence can be controlled and regulated, if necessary.

BRIEF DESCRIPTION OF THE DRAWINGS

The invention is described using illustrations. These depict.

Figure 1:
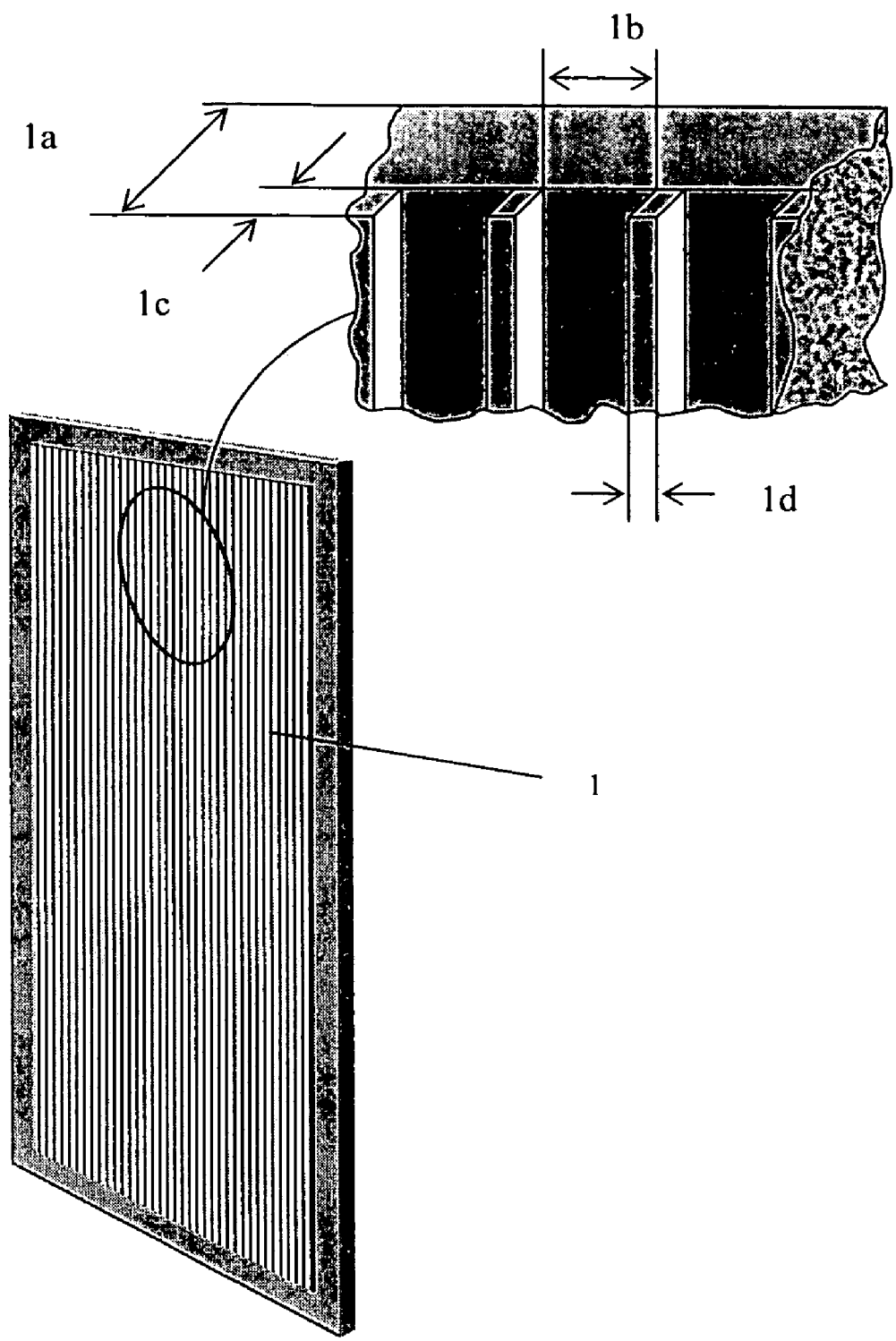
FIG. 1 a fluid guidance plate (1) in schematic depiction, as well as an enlarged detail of the same.

The central component of the microreactor is the fluid guidance plate (1, FIG. 1). The plate keeps the reacting liquid in special capillary grooves using capillary forces on its surface. It has a thickness (1*a*) of 120 μm to 4000 μm, preferably of 200 μm to 2000 μm. It contains open capillary grooves in which threads of liquid are created. These capillary grooves have a width (1*b*) of 20 μm to 2000 μm, preferably of 50 μm to 1500 μm, in particular 100 μm to 300 μm and a depth (1*c*) of 20 μm to 500 μm, preferably of 50 μm to 300 μm, in particular 60 μm to 150 μm. The partition walls (1*d*) between two neighboring capillary grooves have a width of 5 μm to 250 μm, preferably of 20 μm to 150 μm, in particular 30 μm to 100 μm.

A further object of the invention is a process for manufacturing a structured fluid guidance plate (1) for a microreactor according to the invention. The structures can be created by etching, laser and water jet cutting and drilling, punching and embossing, milling, planing, micro spark erosion, punch drawing, punching and drilling, injection molding and sintering as well as with LIGA-technology and with combinations of these.

Figure 4:
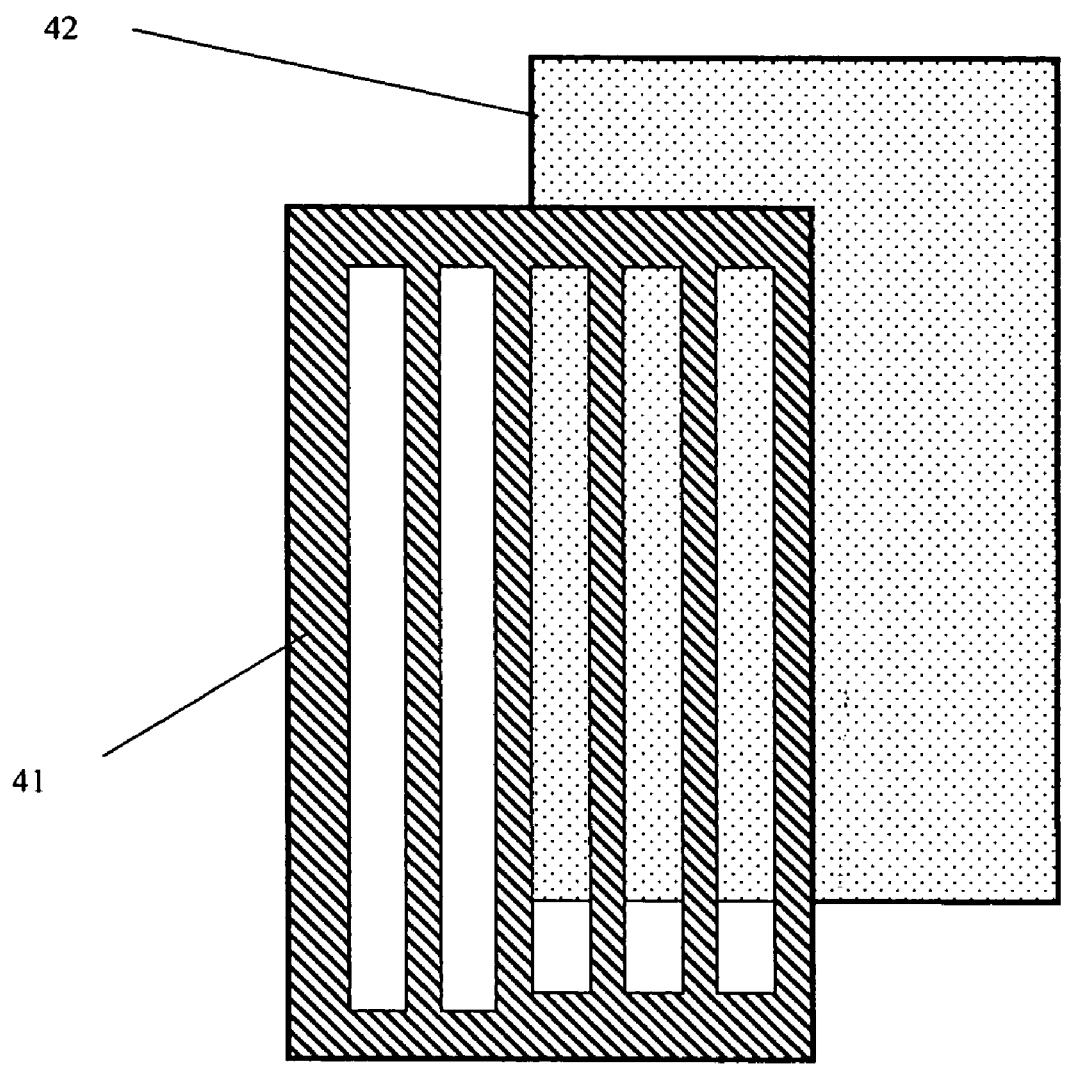
FIG. 4 the structure of a fluid guidance plate (1) made from two elements, a grid-shaped element (41) and an unstructured element (42) in schematic depiction.

In a further process according to the invention, one attaches a grid-shaped plate (41) onto a second, unstructured plate (42) (FIG. 4), and, if necessary, coats the compound with catalytic material.

An object of the invention thus is a fluid guidance plate (1) with a wall thickness of 120 μm to 4000 μm, preferably 200 μm to 2000 μm for a microreactor according to the invention, mainly consisting of two coplanar elements attached on top of each other, whereby a. the first element (41) has a wall thickness of 20 μm to 500 μm, preferably of 50 μm to 300 μm, in particular 60 μm to 150 μm, and a grid-shaped structure with several partition walls arranged in parallel that stretch between two partition walls of the same thickness that are arranged orthogonally to them, whereby the breakthroughs between the partition walls that are arranged in parallel have a width of 20 μm to 2000 μm, preferably of 100 μm to 250 μm, in particular 150 μm to 200 μm and the partition walls arranged in parallel have a width of 5 μm to 250 μm, preferably of 20 μm to 150 μm, in particular 30 μm to 100 μm.

b. the second element (42) is an unstructured, plane plate of the same length and width as the first element (41) and has a thickness of 20 μm to 3980 μm.

The fluid guidance plate (1) usually has a length of 2 to 50 cm, preferably 4 to 40 cm, in particular 5 to 25 cm and a width of 5 to 25 cm, preferably 6 to 20 cm, in particular 7 to 15 cm.

Figure 2:
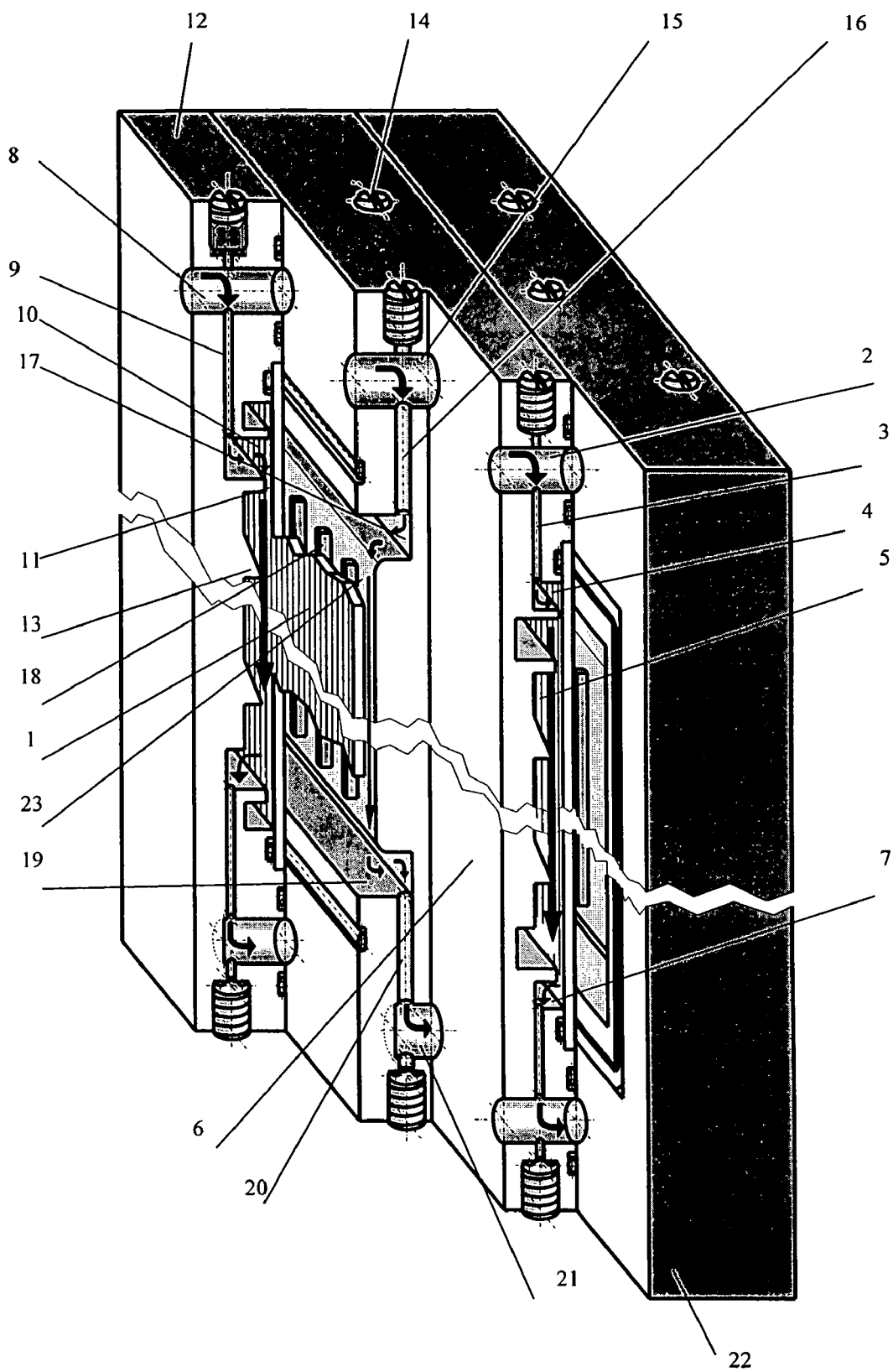
FIG. 2 a microreactor according to the invention consisting of five structured plates with inlets and outlets.

In the realization example depicted in FIG. 2, it is assumed that the microreactor according to the invention consists of five structured plates, one bottom plate (22), an intermediate plate (6), and a top plate (12) as well as two fluid guidance plates (1). The two fluid guidance plates (1) are both arranged between two of these plates and are sealed on the rear using, for example, o-ring seals. Preferably, the inlet tubes (2), (8) and (15) are also sealed using o-ring seals.

Positioning pins and screws that press the plates together to produce a seal are not depicted.

The fluid guidance plate (1) is supported by an intermediate plate (6) or the bottom plate (22), through which the fluid reaction partner is fed into the reactor via the inlet tube. The inlet tube is connected to a bore (3) that leads to the distribution channel (4), which ensures a uniform distribution of the current. A bottleneck is planned between the distribution channel (4) or the liquid collection channel (7) and the reaction chamber (5). Such a bottleneck can be achieved, for example, by pressing the microstructured fluid guidance plate (1) to the intermediate plate (6) and the microchannels that are thus created restrict the flow of the fluid reaction partner. After the liquid has passed this bottleneck, it comes into contact with the gaseous reaction partner. This contact is maintained as long as the fluid reaction partner flows down the microcapillary grooves of the fluid guidance plate (1).

The gaseous reaction partner flows in an analogous way via the gas inlet tube (8) and the branching-off bore (9) into the gas distribution channel (10). These bores can be closed using screws (14) on the exterior casing. The flow path of the gas is equipped with bottlenecks (11) that are formed by the fluid guidance plate (1) and an intermediate plate (6) and/or the top plate (12).

As the gas flow rate can exceed that of the liquid by several times, the reaction chamber (5) is designed with an accordingly larger width than the microchannels on the fluid guidance plate (1). This could have a negative effect on the mass transfer in the gas phase. Therefore, the reaction chamber (5) is preferably equipped with ramps (13), which in particular are arranged in a staggered pattern, and which improve the mass transfer.

The assignment and distribution of the liquid as well as of the gas occurs via horizontal distribution channels and can occur from the same side or from opposite sides of the reactor. The liquid as well as the gaseous components of the reaction mixture can be discharged together or separately via horizontal channels.

If the reaction takes place under pressure, the partition walls (18) serve to avoid a bending of the reaction plate 1. Thus, pressures of $10^{-3}$ bar to 300 bar, preferably 1 to 10 bar can be applied.

Using combined heating and evacuating, low-boiling components of the reaction mixture can be removed from the liquid phase through vaporization and be discharged together with the gaseous phase.

The reaction conditions (thread thickness, concentration, temperature, pH value, flow rates) can be controlled using sensors.

The liquid reaction mixture flows from the main inlet tube (2) through branch-offs (3) into the individual reactor units. A uniform distribution of the flow across the entire width of the fluid guidance plate (1) can be achieved in a number of ways:

a. as depicted in FIG. 2, using a distribution channel with a bottleneck downstream. This bottleneck can be formed by:
  (i) a small crack between the microstructured fluid guidance plate (1) and a counterpart with a flat face surface that is pressed against the microstructured area (1), whereby small channels with a defined pressure loss are created.
  (ii) a small crack between an even area of the fluid guidance plate (1) and a counterpart with a microstructured face surface that is also pressed against the fluid guidance plate (1) in order to form small channels with a defined pressure loss.
  (iii) a porous flow resistance that is arranged between the distribution channel (4) and the reaction chamber (5).

b. using an equal flow distribution network instead of the distribution channel, preferably designed as a bifurcation network.

c. with a set of jets that spray the liquid reactant onto the fluid guidance plate (1) and thus uniformly distribute the liquid.

Preferably, a further pressure-loss barrier is installed at the lower end of the capillary thread, in order to also ensure uniform flow for the liquid discharge. This avoids that the reaction chamber (5) is flooded and ensures a uniform distribution of the residence time of the liquid in the microreactor according to the invention.

The pressure-loss barriers fulfill a further function. They simultaneously ensure that the contact between liquid and gas only stretches over the tempered area.

The reaction gas enters the reactor unit via the bore (9) that branches off from the reaction gas inlet tube (8). From there, the gas flows into the gas distribution channel (10), which, together with the bottleneck (11), ensures a uniform distribution across the width of the fluid guidance plate (1). The bottleneck (11) causes a higher pressure loss than the gas distribution channel (10), so that gas flows with the same value per unit length at every point. The following possibilities can be used as alternatives for achieving a uniform flow distribution of the gas:

a. narrow bottlenecks between the gas distribution channel (10) and the reaction chamber (5);
b. a porous or otherwise gas permeable material instead of discrete openings;
c. a bifurcation network instead of the combination of gas distribution channel and flow resistance towards the reaction chamber.

Preferably, a further uniform distribution collector is installed at the lower exit from the reaction chamber (5), in order to ensure a uniformly distributed, homogenous flow field in the lower part of the reaction chamber (5).

It is advantageous if the liquid and the gas phase are discharged separately. However, if extremely short residence times of the liquid phase are required, the two phases can be discharged together.

In order to ensure sufficient mass transfer in the gas phase in cases where a minimum turnover is required, the residence time of the reaction gas in the reaction chamber should be sufficiently long. This means that the width of the gas chamber can amount to up to 10 mm. In such wide channels, experience has shown that diffusion alone is not strong enough for allowing each reactant molecule to contact the liquid phase. In order to intensify the mass transfer, special ramps (13) are installed on the side of the reaction chamber (5) opposite to the fluid guidance plate (1). They have the effect that the boundary layer flow is guided away from the wall in the direction of the microcapillary plate. In order to further intensify this effect, they are usually arranged in a staggered pattern.

On the liquid side, the thickness of the capillary thread and the microstructuring of the fluid guidance plate (1) significantly influence the mass transfer. The average capillary thread thickness adjusts itself according the liquid charge and the liquid properties (such as density, viscosity, etc.). The higher the selected throughput, the larger the thread thickness and thus also the distance that the reactants in the liquid have to diffusively cover.

The fluid guidance plate (1) can be cooled or heated on its rear side, whereby a liquid or gaseous heat-transporting medium flows through channels of 0.5 to 2 mm width. The supply of the heat transfer medium occurs via an inlet tube (15) and bores (16) that branch off to the individual reaction plates (1). The discharge of the heat transfer medium occurs via the heat transfer medium collector (19), bores (20) and the outlet tube (21). The interaction between the heat transfer medium distribution channel (17) and the heat transfer channels (23) causes a good uniform flow distribution of the heat transfer medium, especially when the inlet tube (15) and the outlet tube (21) are arranged diagonally in the intermediate plate (6), which is not depicted in FIG. 2 for reasons of clarity.

Tempering of the reaction layer is possible from the rear using liquid or gaseous mediums in a temperature range from −80° C. to +500° C., preferably from −60° C. to +300° C. As an alternative to tempering the fluid guidance plate using fluid tempering mediums, a solid, e.g. an electrically heated block or a Peltier element, can be used as a tempering element.

Figure 3:
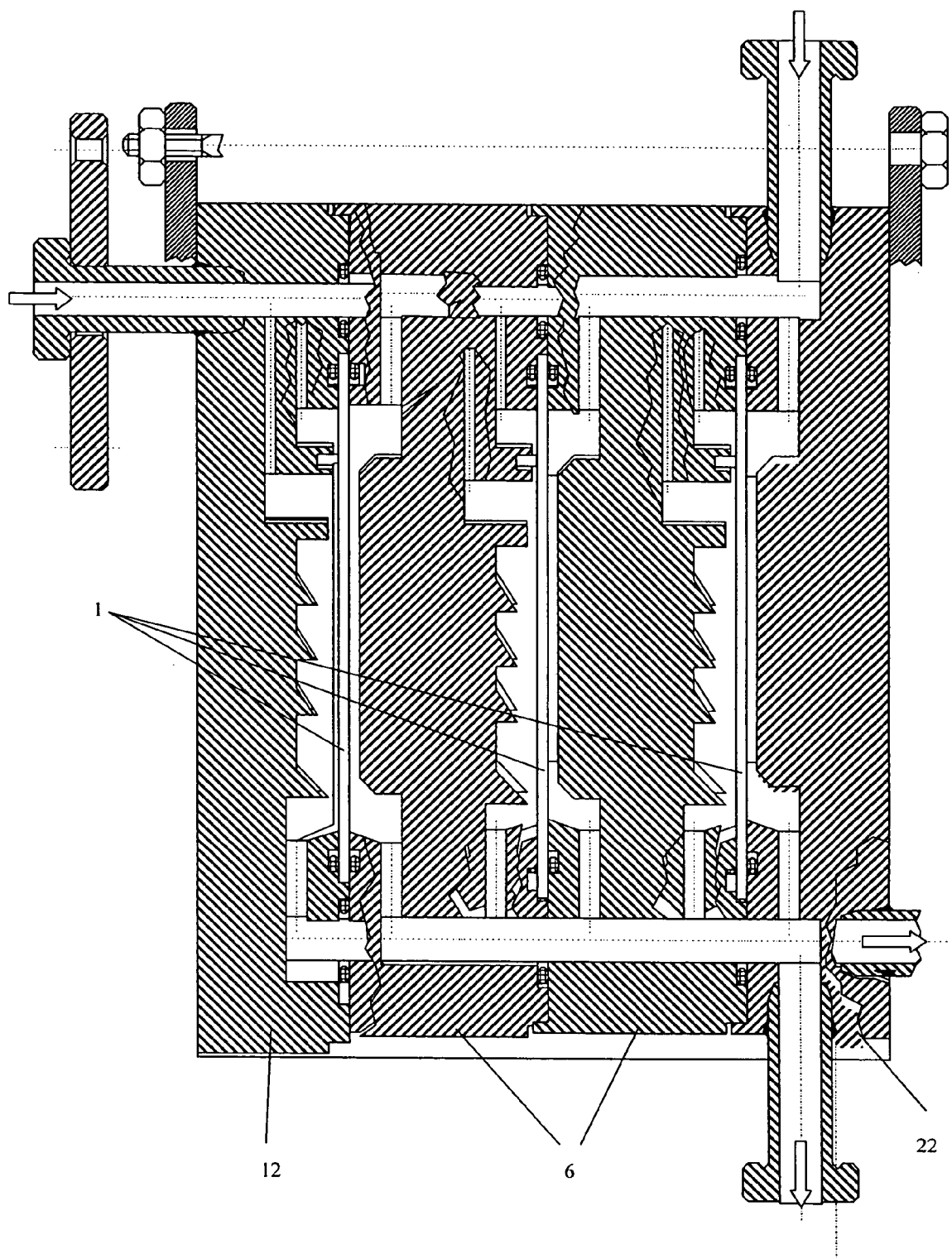
FIG. 3 a section through an arrangement of three microreactors according to the invention connected in parallel.

Using internal parallelization, i.e. the connection of several individual reactors to form a rector block, the turnover amount can be increased into the technically relevant range. A reactor is already created by combining a bottom plate (22) with a fluid guidance plate (1) and a top plate (12). By adding an intermediate plate (6), and a further fluid guidance plate (1), an additional reactor module is created. FIG. 3 depicts the parallelization of three microcapillary reactors. The liquid and gaseous reactants are fed in via a common inlet tube and evenly distributed among the individual reaction units. The discharge of the collected liquid/gaseous phases also occurs via a common outlet. Thus a modular reaction system with a freely scalable number of intermediate plates (6) and fluid guidance plates (1) is created.

The individual plates or layers can be joined using screw connections or clamping devices, if a detachable assembly is required. You can also use welding, bonding, gluing, soldering or riveting, if such a reaction system is not to be changed once it has been assembled.

A further object of the invention is a process for manufacturing a microreactor according to the invention for carrying out chemical reactions, which comprises the following steps:

a. Manufacture of plates or layers whose surfaces are treated using micro and or precision engineering so that they form reaction and or function spaces in combination with a further plate or layer;
b. Manufacture of one or several fluid guidance plates (1);
c. Stacking of the individual plates or layers in a suitable order and orientation; and
d. Sealing by pressing together or fixed or removable joining of the individual plates or layers.

The structuring in steps (a) and/or (b) can be achieved by etching, laser and water jet cutting and drilling, punching and embossing, milling, planing, micro spark erosion, punch drawing, punching and drilling, injection molding and sintering as well as with LIGA-technology and combinations of these.

As the manufacture of microstructures usually is a costly and elaborate process, the manufacture of the fluid guidance plates (1) in step (b) is preferably carried out using two elements. On a first plate (41), breakthroughs are created instead of notches, so that a grid is formed. This is attached onto a second, unstructured plate (42). The two elements can be made from the same or from different materials.

The layers have to be stacked in such a fashion that on one hand, the fluid guiding structures and the partition walls are completely maintained. On the other hand, the layers have to be joined in such a way that they are completely sealed against liquids and gases.

The materials from which the plates are made mainly depend on the substances to be processed and the chemical processes to be carried out. In general, materials suitable for chemistry such as metal, glass, ceramics, plastics and semiconductor material as well as combinations of these come into consideration. Preferably, the following materials are used: graphite, ceramics, plastics, catalytically active materials, stainless steel or tantalum. Combinations of different materials are possible.

In a further, preferred optimal realization of the microreactor according to the invention, catalytically active metals form the material of the fluid guidance plate (1) or are applied to it, e.g. by vaporization or coating. For catalyzed gas-liquid reactions, a close contact between gas, liquid and catalyst (=metal surface) is especially important. In the equipment according to the invention, close contact is ensured by very thin films of liquid.

If a shorter residence time of the liquid on the reaction plate is desired, the plate can be installed at an angle of ≦0° preferably of 45° to 90°, in particular 60° to 90°, mostly preferred at about 90° to the horizontal plane.

In total, the invention provides a miniaturized reaction system with a modular structure, which, due to its microstructure, is suitable for carrying out reactions in which at least one fluid reaction partner reacts with at least one gaseous reaction partner and which, due to the implementation of a variable number of intermediate plates (6) and fluid guidance plates (1), allows the amount of throughput to be freely scaled.

The microreactor system according to the invention features a number of advantages that are of great importance for carrying out such reactions and are not found in conventional microreactors or in vertical tube reactors:

a. The thin layers that can be realized in the microreactor according to the invention improve diffusive mixing across the liquid cross-section.
   (i) An improved mass transfer on the liquid side with comparable residence times causes an acceleration of fast, diffusion-controlled reactions.
   (ii) The reaction liquid features a more narrow variation in residence time. With this, the reaction conditions can be controlled much more exactly and thus be optimized faster.
   (iii) Shortening the residence time while keeping the throughput at the same level reduces the amount of by-products.
b. Very thin capillary threads enable more effective tempering and thus improved control of the temperature.
   (i) Thus also suitable for highly exothermal reactions and thus possibility of carrying out reactions that would otherwise be very dangerous (e.g. direct halogenations), but at least minimization of the danger potential.
   (ii) The creation of undesirable by-products is reduced.
c. Specially formed microstructures that are inserted into the plates form a multiplicity of capillary threads. This avoids the formation of drops and runnels.

Object of the invention thus is a procedure, in particular a continuous procedure, for carrying out chemical reactions between a reaction partner in liquid form and a gaseous reaction partner in spaces that are formed by two or several plates or layers of a reactor according to the invention to produce one or more gaseous, liquid, solved and/or suspended reaction products, characterized by the fact that the fluid reaction partner flows solely due to the influence of gravity and/or capillary forces in one essentially uninterrupted capillary thread along the surface of at least one plate or layer and thereby comes into contact and reacts with the gaseous reaction partner.

Usually, the reactants, of which there are at least two, are made to react in the presence of at least one thinner in a microreactor according to the invention. Preferred thinners are halogenated aliphatic or aromatic hydrocarbons such as for example hexane, cyclohexane, dichloromethane, tetrachloromethane, 1,2,2-trifluor-1,1,2-trichloroethane, benzene, toluene or chlorobenzene; or ethers such as for example, diethyl ether, tert-butyl methyl ether, dioxane or tetrahydrofuran; ketones or amides such as for example acetone, methyl ethyl ketone, dimethyl formamide or N-methylpyrrolidone; or alcohols such as for example methanol, ethanol, propanol, isopropanol or butanol; or acetonitrile or water or mixtures of these thinners.

Examples for reactions according to the invention are reductions of reducible chemical compounds with gaseous hydrogen, in particular catalytic hydrogenation of organic nitrogen compounds.

Amines are often produced through the reduction of nitrogen compounds. Often, the catalytic hydrogenation with hydrogen using a heterogeneous catalyst is the only practicable and gentlest method.

In conventional operating mode in a vibration reactor, stirrer tank or in autoclaves, a number of problems arise:

Due to unstable protected groups, the temperatures have to be kept at a low level, which causes the reaction time to increase significantly. Also, an additional work step is necessary for removing the catalyst from the reaction solution and recycling it after the reaction. Due to the generation of heat, only strongly diluted solutions can be used.

Using the microreactor according to the invention has the following advantages:

The reaction time is reduced significantly

Highly concentrated solutions or even the substance itself can be used

The catalyst is neither worn nor does it have to be recycled or recovered

The reaction heat is discharged very quickly and fewer side reactions take place, which means that the selectivity is increased. The end product is produced in a purer form.

Further examples of processes according to the invention are the halogenation of halogenatable chemical compounds with gaseous chlorine or fluorine, in particular the chlorination of aliphatic carboxylic acids and the fluorination of aromatics.

The chlorination of acetic acid is conventionally carried out in bubble column reactors. In these, besides the desired product of monochloro acetic acid, over 3% of dichloro acetic acid is produced. This has to be separated in elaborate and costly reprocessing procedures. In the described reaction in a microcapillary reactor, the share of 1,1-dichloro acetic acid can be reduced to under 0.05%.

Direct fluorination with elementary fluorine is the alternative possibility to the Balz-Schiemann reaction and to the Halex process for the selective fluorination of aromatics. The main problems with this are found on one side in the high reactivity of the elementary fluorine, which besides unspecific substitution also adds to the aromatics, and on the other side in the high exothermicity of reactions with elementary fluorine, which make these reactions hard to control. By operating with microcapillary reactors, an optimum temperature control and thus a high selectivity with minimum risk is possible.

Further examples of processes according to the invention are alkoxylations, especially the ethoxylation of alkoxylatable chemical compounds, especially the reaction of carboxylic acid, phenols and alcohols with gaseous epoxides.

Different catalysts are used for ethoxylating fatty alcohols or fatty acids. Alkoxylations, e.g. the ethoxylation of fat derivates, are carried out with catalysts that are as cost-effective as possible and basic (e.g. alkali hydroxide).

The conversion of fatty alcohols, in particular lauryl alcohol, with ethylene oxide in the microcapillary reactor according to the invention has the following advantages, besides an extremely narrow distribution of molecular weights:

Extremely thin threads (20 μm) considerably reduce the reaction time (as it is a diffusion-controlled reaction) and allow for a highly exact and quick temperature control and thus a strongly reduced share in by-products.

Simple setting of different residence and contact times is possible by tilting the small dimensioned reactor (selectable between 1 second and 300 seconds)

By having only very small amounts of reagents in the reaction space, there is a very low risk potential Further examples of procedures according to the invention are oxidations of oxidatable chemical compounds with gaseous oxygen or ozone, in particular melting oxidation of polyethylene wax, reactions with phosgene as well as reactions with hydrogen cyanide.

In order to facilitate the understanding of the invention at hand, the following illustrative examples for possible reactor types are shown. The invention at hand is not restricted to these specific optimal realizations but comprises the full extent of the patent claims.

EXAMPLE 1

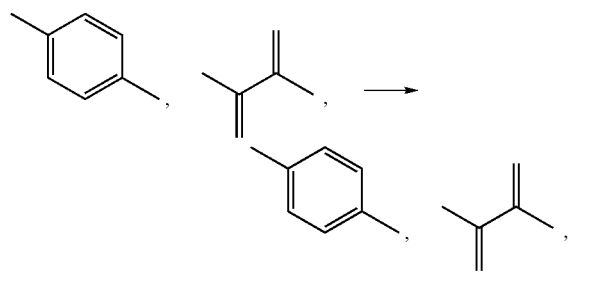

The reaction is carried out in a microreactor according to FIG. 3. 9 intermediate plates (6) are used, which implies an arrangement that is parallelized 10 times. The bottom plate (12), top plate (22) and intermediate plates (6) is made from graphite, the fluid guidance plate (1) is made from graphite with a palladium coating.

| Dimensions | |
|---|---|
| Fluid guidance plate: | length 15 cm, width 10 cm, thickness 300 μm, |
| Capillary grooves: | width 200 μm, depth 80 μm, |
| Partition walls: | width 35 μm |

23.7 g (0.01 mole) 1-ethoxalyl-2(4-nitrophenyl)-hydrazine are dissolved in 150 ml methanol and 50 ml tetrahydrofuran. Oxygen is abandoned using an excess pressure of 0.1 bar. The solution is guided over a graphite plate coated with palladium at a flow velocity of 5 ml/min at 50° C. The reaction product is removed from the equipment and the thinners are evaporated until yellow crystals are separated out. These are washed using isopropyl and diethyl ether and dried in a vacuum. The product 1-ethoxalyl-2(4-aminophenyl)-hydrazine is created in quantitative amounts.

EXAMPLE 2

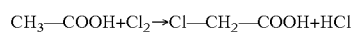
$CH_3$—COOH+$Cl_2$→Cl—$CH_2$—COOH+HCl

The reaction is carried out in a microreactor according to FIG. 3. 4 intermediate plates (6) are used. The bottom, top and intermediate plates are made from graphite, the fluid guidance plate (1) from tantalum.

| Dimensions | |
|---|---|
| Fluid guidance plate: | length 30 cm, width 10 cm, thickness 2000 μm, |
| Capillary grooves: | width 1500 μm, depth 300 μm, |
| Partition walls: | width 150 μm |

Acetic acid as well as 15 mole-% acetyl chloride are continuously fed together into a microcapillary reactor. The liquid throughput is set to 45 g/min. The temperature is set to 180° C. Chlorine gas is passed through the reactor at a uniform flow rate such that the share of chlorine in the exhaust gas flow is less than 0.1%. The exhaust gas and the product are discharged together from the microcapillary reactor into a sedimentation container, where fluid and gaseous phases are separated from each other. By reacting with water, any remaining acid chlorides and anhydrides in the liquid raw acid are converted into free acids. The hydrogen chloride produced is let off. The share of monochloro acetic acid in the liquid reaction product amounts to about 85%. The acetic acid that was not converted (share 11-12%) is distilled off at 150 mbar and 80° C. The share of dichloro acetic acid is under 0.05%. Further cleansing is therefore not necessary.

EXAMPLE 3

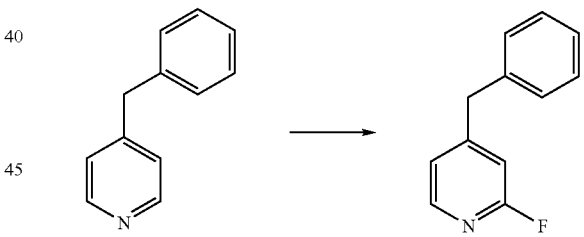

The reaction is carried out in a microreactor according to FIG. 2, however without the use of intermediate plates (6). The bottom (12) and top plates (22) as well as the fluid guidance plate (1) are made from a nickel-copper alloy (Monell metal).

| Dimensions | |
|---|---|
| Fluid guidance plate: | length 5 cm, width 7 cm, thickness 200 μm, |
| Capillary grooves: | width 100 μm, depth 50 μm, |
| Partition walls: | width 40 μm |

2.5 g 4-benzylpyridine are dissolved in 50 ml 1,2,2,-trifluor-1,1,2,trichloroethane. The liquid flow rate amounts to 1 ml/min. Fluorine (10% $F_2$ in $N_2$) is fed through the reactor in the opposite direction to the capillary threads at an excess pressure of 2 bar. The reaction is carried out at −25°

C. The organic phase is washed with water, 1N HCl and saltwater. After drying with $Na_2SO_4$, volatile components are distilled off using a rotary evaporator. A yellow oil is produced. The yield of 2-fluorine-4-benzylpyridine amounts to 50%.

EXAMPLE 4

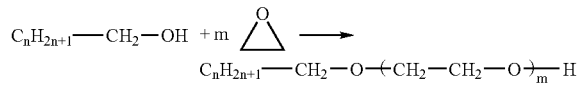

The reactions are carried out in a microreactor according to FIG. 2, however without the use of intermediate plates (6). The bottom, top and fluid guidance plate are made from steel.

| Dimensions | |
| --- | --- |
| Fluid guidance plate: | length 20 cm, width 10 cm, thickness 300 μm, |
| Capillary grooves: | width 200 μm, depth 70 μm, |
| Partition walls: | width 30 μm |

Lauryl alcohol with 1 weight-% catalyst (NaOH, dissolved in the lauryl alcohol) are continuously fed into a microcapillary reactor. The liquid throughput is set to 2 g/min. Gaseous ethylene oxide is fed through in a direction opposite to the liquid flow, at an excess pressure of 1 bar. The reaction product is removed and the catalyst filtered off.

| Specifications: | | |
| --- | --- | --- |
| Angle to the horizontal plane: | 90° | 45° |
| Temperature: | 175° C. | 155° C. |
| Share of molecules with 2-4 added EO-units: | >80% | >70% |
| By-product content (polydiole, 1,4 dioxane): | <0.5% | <0.1% |
| Residence time for a throughput over the reaction zone of the microcapillary plate | 10 s | 20 s |

By carrying out the reaction at an angle of 45° and the longer residence time caused by this, a complete conversion can also be achieved at lower temperatures. This lowers the by-product content, at the same time the range of the molecular weight distribution is widened.

The invention claimed is:

1. A microreactor for carrying out chemical reactions between a liquid reactant and a gaseous reactant, comprising:
(a) a fluid guidance plate comprising a plurality of longitudinally extending elongate open channels, such channels being configured so that when the liquid reactant is introduced into the plurality of open channels, dimensions of said plurality of open channels ensure that a capillary action establishes a capillary thread of the liquid reactant that is retained in said plurality of longitudinally extending elongate open channels, even when the fluid guidance plate is oriented in a vertical position, the liquid reactant being conveyed through the plurality of longitudinally extending elongate open channels by the capillary action when the fluid guidance plate is in a horizontal position, and by the capillary action and a gravitational force when the fluid guidance plate is in a non-horizontal position; and
(b) a reaction volume disposed adjacent to the fluid guidance plate, so that the reaction volume is in fluid communication with the plurality of longitudinally extending elongate open channels, so that when the gaseous reactant is introduced into the reaction volume, the gaseous reactant is in fluid communication with the liquid reactant that is retained in and which is being conveyed in said plurality of longitudinally extending elongate open channels, a product being produced by a reaction between the gaseous reactant and the liquid reactant, said product being conveyed through the plurality of longitudinally extending elongate open channels by the capillary action when the fluid guidance plate is in a horizontal position, and by the capillary action and a gravitational force when the fluid guidance plate is in a non-horizontal position.

2. The microreactor according to claim 1, wherein the fluid guidance plate is disposed in a non-vertical orientation, thereby reducing a magnitude of a flow rate of the liquid reactant attributable to the gravitational force as compared to the flow rate of the liquid reactant when the fluid guidance plate is disposed in the vertical orientation.

3. The microreactor according to claim 1, wherein the fluid guidance plate comprises a rear wall, the rear wall defining a bottom of the plurality of open channels, and the rear wall of the fluid guidance plate is in contact with a heat exchange volume, thereby enabling a temperature of a material in the plurality of open channels to be moderated.

4. The microreactor according to claim 3, wherein:
(a) the fluid guidance plate farther comprises a plurality of longitudinally extending panels coupled to the rear wall, the panels defining sidewalls of the plurality of open channels, the longitudinally extending panels having a width ranging from about 5 μm to about 250 μm;
(b) the rear wall has a thickness ranging from about 120 μm to about 4000 μm, and
(c) the plurality of longitudinally extending open channels have a width ranging from about 20 μm to about 2000 μm, and a depth ranging from about 20 μm to about 500 μm.

5. The microreactor according to claim 1, wherein the fluid guidance plate is sandwiched between a top plate and a bottom plate, the top plate defining the reaction volume and the bottom plate defining a heat transfer volume.

6. The microreactor of claim 5, wherein a number of reaction volumes in the microreactor can be increased by inserting a desired number of intermediate plates and additional fluid guidance plates between the bottom plate and the top plate in an alternating fashion, where an equal number of intermediate and fluid guidance plates are employed, each intermediate plate added defining an additional reaction volume.

7. The microreactor according to claim 1, further comprising:
(a) one or more separate and/or common inlet tubes for the liquid reactant;
(b) one or more inlet and discharge tubes for the gaseous reactant;
(c) one or more separate and/or common discharge tubes for the produced reaction mixture;
(d) one or more inlet and discharge tubes for a heat exchange medium; and
(e) sensors for controlling the reaction conditions.

8. The microreactor according to claim 1, further comprising means for uniformly distributing the liquid reactant to the open channels.

9. The microreactor according to claim 1, further comprising a bottleneck disposed between a gaseous reactant inlet and the reaction volume.

10. The microreactor according to claim 9, wherein the reaction volume is equipped with ramps for improving a mass transfer of the reactants.

11. The microreactor according to claim 1, wherein a rear wall of the fluid guidance plate is thermally conditioned by a heat transfer medium flowing through channels ranging from about 0.5 mm to about 2 mm in width.

12. The microreactor according to claim 1, wherein the fluid guidance plate is made from at least one element selected from the group consisting essentially of graphite, ceramic, plastic, and metal.

13. The microreactor according to claim 1, wherein the fluid guidance plate comprises a catalyst.

14. The microreactor of claim 1, wherein the fluid guidance plate comprises:
  (a) a first element, the first element comprising an unstructured plate having a first end, a second end, a length, a width, and a thickness, the first element defining a rear wall of the fluid guidance plate;
  (b) a second element coupled to the first element, the second element comprising a structured plate having a first end, a second end, a length corresponding to the length of the first element, a width corresponding to the width of the first element, and a thickness, the structured plate including a plurality of elongate parallel openings extending from the first end to the second end, each opening thus defining one of the plurality of longitudinally extending open channels, solid portions of the second element disposed between each opening defining the longitudinally extending panels of the fluid guidance plate.

15. The microreactor of claim 14, wherein:
  (a) the thickness of the first element ranges from about 20 μm to about 4000 μm;
  (b) the thickness of the second element ranges from about 20 μm to about 500 μm;
  (c) each opening in the second element has a width ranging from about 20 μm to about 2000 μm; and
  (d) a distance between adjacent openings in the second element ranges from about 5 μm to about 250 μm.

16. A microreactor for carrying out chemical reactions between a liquid reactant and a gaseous reactant, comprising:
  (a) a fluid inlet for the liquid reactant;
  (b) a fluid inlet for the gaseous reactant;
  (c) a fluid guidance plate having a first end and a second end, a rear wall and a plurality of panels extending longitudinally between the first end and the second end, thereby defining a plurality of longitudinally extending elongate open channels, the rear wall serving as a floor for each channel of the plurality of longitudinally extending elongate open channels, and adjacent panels serving as sidewalls for each longitudinally extending elongate open channel, the first end being coupled in fluid communication with the fluid inlet for the liquid reactant, so that when the liquid reactant is introduced into the plurality of longitudinally extending elongate open channels, the liquid reactant being conveyed through said plurality of longitudinally extending elongate open channels toward the second end by a capillary action when the fluid guidance plate is disposed in a horizontal position, and by the capillary action and a gravitational force when the fluid guidance plate is disposed in a non-horizontal position, thereby establishing an uninterrupted capillary thread of liquid reactant in each longitudinally extending elongate open channel; and
  (d) a reaction volume disposed adjacent to the fluid guidance plate and between the first end and the second end, the reaction volume being coupled in fluid communication with the fluid inlet for the gaseous reactant, the reaction volume being in fluid communication with the plurality of longitudinally extending open channels, so that the gaseous reactant in the reaction volume reacts with the liquid reactant being conveyed in said plurality of longitudinally extending open channels to generate a product in the plurality of longitudinally extending elongate open channels; and
  (e) a product outlet coupled in fluid communication with the second end of the fluid guidance plate, to collect the product from said plurality of longitudinally extending elongate open channels.

17. A microreactor for carrying out chemical reactions between a liquid reactant and a gaseous reactant, comprising:
  (a) a fluid guidance plate having:
    (i) a first end and a second end, a rear wall, and a plurality of panels extending between the first end and the second end, said plurality of panels defining a plurality of elongate open channels, the rear wall serving as a floor for each channel of the plurality of longitudinally extending elongate open channels, and adjacent panels serving as sidewalls for each channel, the liquid reactant being conveyed through said plurality of elongate open channels toward the second end by a capillary action when the fluid guidance plate is disposed in a horizontal position, and by the capillary action and a gravitational force when the fluid guidance plate is disposed in a non-horizontal position; and
    (ii) means for establishing an uninterrupted capillary thread of liquid reactant in said plurality of the elongate open channels, such that the capillary thread of liquid reactant is retained within said plurality of elongate open channels, even when the fluid guidance plate and said plurality of elongate open channels are oriented in a vertical position; and
  (b) a reaction volume disposed adjacent to the fluid guidance plate and between the first end and the second end, the reaction volume being coupled in fluid communication with the plurality of elongate open channels, so that the gaseous reactant in the reaction volume reacts with the liquid reactant being conveyed in said plurality of elongate open channels to generate a product in said plurality of elongate open channels.

18. A method for using a fluid guidance plate for reacting a liquid reactant and a gaseous reactant to form a chemical product, comprising the steps of:
  (a) introducing the liquid reactant into the fluid guidance plate, the fluid guidance plate comprising a plurality of elongate open channels, thereby establishing a plurality of uninterrupted capillary threads of the liquid reactant in the plurality of elongate open channels, a capillary action retaining the liquid reactant in the plurality of elongate open channels even when the fluid guidance plate is in a non-horizontal position, the liquid reactant being conveyed through the plurality of elongate open channels by the capillary action when the fluid guidance plate is in a horizontal position, and by the capillary action and a gravitational force when the fluid guidance plate is in the non-horizontal position;

(b) introducing the gaseous reactant into a reaction volume, the reaction volume being in fluid communication with the plurality of elongate open channels, such that the gaseous reactant is placed in fluid communication with the liquid reactant while the liquid reactant is retained in the plurality of elongate open channels, a reaction between the gaseous reactant and the liquid reactant generating the chemical product, the chemical product being conveyed away from the reaction volume in the plurality of elongate open channels by the capillary action when the fluid guidance plate is in the horizontal position, and by the capillary action and the gravitation force when the fluid guidance plate is in the non-horizontal position.

19. The method of claim 18, wherein the gaseous reactant is selected from the group consisting essentially of hydrogen, fluorine, chlorine, oxygen, and an alkylene oxide.

20. A method for reacting a liquid reactant and a gaseous reactant to form a chemical product, comprising the steps of:

(a) establishing a plurality of uninterrupted capillary threads of the liquid reactant, a flow rate of the liquid reactant in the capillary threads being provided a capillary action when the plurality of uninterrupted capillary threads are disposed in a horizontal configuration, and by the capillary action and a gravitational force when the plurality of uninterrupted capillary threads are disposed in a non-horizontal configuration, the capillary action inhibiting the liquid reactant from diverging from each capillary thread when the plurality of uninterrupted capillary threads are disposed in the non-horizontal configuration; and (b) placing a gaseous reactant in fluid communication with the plurality of capillary threads, such that the gaseous reactant is placed in fluid communication with the liquid reactant, a reaction between the gaseous reactant and the liquid reactant generating the chemical product in the plurality of capillary threads.

21. The method of claim 20, further comprising the step of manipulating a flow rate of the liquid reactant in the plurality of capillary threads by moving a fluid guidance plate supporting the plurality of capillary threads to a desired orientation between a vertical position and a horizontal position, where a minimum flow rate is achieved when the fluid guidance plate is in the horizontal position, the flow rate in the horizontal position being provided by the capillary action alone, and wherein a maximum flow rate is achieved when the fluid guidance plate is in the vertical position, the flow rate in the vertical position being provided by both the capillary action and the gravitational force, the flow rate continuously decreasing as the orientation of the fluid guidance plate is moved between the vertical position and the horizontal position.

* * * * *